United States Patent [19]

Chiang et al.

[11] Patent Number: 4,904,611
[45] Date of Patent: Feb. 27, 1990

[54] FORMATION OF LARGE GRAIN POLYCRYSTALLINE FILMS

[75] Inventors: Anne Chiang, Cupertino; I-Wei Wu, San Jose; Tiao-Yuan Huang, Cupertino, all of Calif.

[73] Assignee: Xerox Corporation, Stamford, Conn.

[21] Appl. No.: 277,432

[22] Filed: Nov. 25, 1988

Related U.S. Application Data

[63] Continuation of Ser. No. 98,259, Sep. 18, 1987, abandoned.

[51] Int. Cl.$^4$ ........................................... H01L 21/265
[52] U.S. Cl. ........................................ 437/21; 437/24; 437/46; 148/DIG. 132
[58] Field of Search ............................ 437/21, 24, 46; 148/DIG. 132

[56] References Cited

U.S. PATENT DOCUMENTS 4,693,759 9/1987 Noguchi et al. ...................... 437/24

FOREIGN PATENT DOCUMENTS 220812 4/1985 German Democratic Rep. .

Primary Examiner—Olik Chaudhuri
Attorney, Agent, or Firm—Serge Abend

[57] ABSTRACT

A method of forming large grain polycrystalline films by deep ion implantation into a composite structure, comprising a layer of amorphous semiconductor material upon an insulating substrate. Implantation is of a given ion species at an implant energy and dosage sufficient to distrupt the interface between the amorphous layer and the substrate and to retard the process of nucleation in subsequent random crystallization upon thermal annealing.

18 Claims, 8 Drawing Sheets

FORMATION OF LARGE GRAIN POLYCRYSTALLINE FILMS

This is a continuation of application Ser. No. 098,259, filed Sept. 18, 1987, now abandoned.

FIELD OF THE INVENTION

This invention relates to the conversion of amorphous silicon films into large grain size polycrystalline films by deep ion implantation and subsequent annealing.

BACKGROUND OF THE INVENTION

Amorphous silicon has been used extensively in solar cells and display applications for a number of years. More recently, a new field of electronics has been growing, based upon the formation of large area circuits of amorphous silicon material upon large, inexpensive, transparent, glass substrates. The enabling technology is the ability to deposit thin films of this semiconducting material over large areas and the processing of circuits using techniques similar to conventional IC processing. Examples of such large area electronics are to be found described in U.S. Pat No. 4,584,592 entitled "Marking Head for Fluid Jet Assisted Ion Projection Imaging Systems", and U.S. Pat. No. 4,588,997 entitled "Electrographic Writing Head", both in the names of H. C. Tuan and M. J. Thompson, and assigned to the same assignee as the present invention. In both of these patents there is taught a large area marking head array including a large number of input or output transducers connected through thin film transistor (TFT) switches to a relatively small number of external array driver lines, all fabricated upon a single, large area substrate.

Although the amorphous silicon TFTs have met with considerable success in their applications, their extremely low carrier mobilities (typically below 1 cm$^2$/V-s) have limited their current driving capacity and ultimately device operating speed. On the other hand, polycrystalline silicon TFTs are expected to achieve higher carrier mobility, on the order of 20 to 100 cm$^2$/V-s and perhaps even higher speeds. From the perspective of device operating speed, this material would appear to present an attractive replacement for amorphous silicon in many applications.

A shortcoming of as-deposited polycrystalline films is their usual small grains which adversely effect carrier mobility. It is known that increasing grain size so as to reduce the number and detrimental effect of grain boundaries in the film will increase carrier mobility and enhance device performance. Usually grain size enhancement has required high temperature processing (>1000° C.) which would not be satisfactory for large area electronic arrays upon the desirable, low cost, glass substrates. For example, Corning 7059 ® is a good, inexpensive, mass produced glass having a high degree of flatness, whose anneal point is 630° C. It would not be prudent for any processing thereon to exceed 600° C. for an extended period of time. Recently the literature has included lower temperature techniques for enlarging grains in polycrystalline silicon thin films. The following two papers are representative of the current state of this art: "*Low Temperature Polysilicon Super Thin-Film Transistor (LSFT)*" by Noguchi et al, published in Japanese Journal of Applied Physics, Part 2 Letters, Vol. 25, No. 2, February 1986 at pp L121–L123 and "*Comparison of Thin Film Transistors Fabricated at Low Temperatures (<600° C.) on As-Deposited and Amorphized-Crystallized Polycrystalline Si*" by Kung et al, published in Journal of Applied Physics 61(4), Feb. 15, 1987 at pp 1638–1642.

The methods described in both of the above-identified papers include amorphizing the polycrystalline film by silicon ion implantation and subsequently recrystallizing the film with a low temperature (<600° C.) anneal. It is reported in the Noguchi et al article that the ion implantation energy is peaked at about the mid-film depth but the location of the implantation energy peak is not discussed in the Kung et al article. In both of the described methods, the effect of ion implantation is to destroy the crystalline lattice structures so as to convert the polycrystalline film to an amorphous form. By selecting the proper ion implantation angle, relative to normal incidence, the implantation will amorphize most of the crystalline grains in the film. Those random crystallites which were aligned with the ion beam will survive and will grow during the subsequent annealing step. Since the density of the surviving crystallites is greatly diminished, each will grow virtually unimpeded and will continue to enlarge until it meets a neighboring grain.

In each of the aforementioned references, the starting material has been a polycrystalline silicon film which has been nearly completely amorphized by ion implantation. The technique of amorphizing and recrystallizing a semiconductor layer, utilizing ion implantation also has been disclosed in the following patents: U.S. Pat. No. 4,463,492 (Maeguchi); U.S. Pat. No. 4,509,990 (Vasudev); and U.S. Pat. No. 4,588,447. It should be understood that the ion implantation step of this known technique results in a film having a predetermined number of grain growth sites.

We have found that it is desirable to use amorphous silicon as a starting material because of its absence of grain growth sites, its lower deposition temperature, compatible with low cost glasses, and its extremely smooth, as-deposited, surface which is a factor in increasing carrier mobility across device channel regions fabricated in the film. Therefore, an object of our invention is to provide a low temperature method for fabricating device grade, large grain, thin film polycrystalline silicon films upon a low cost, insulating, glass substrate. It is another object of this invention to process an amorphous silicon film so as to retard nucleation and cause it to occur randomly from the bottom surface of the amorphous film during a subsequent thermal annealing step, for allowing more extended grain growth.

SUMMARY OF THE INVENTION

These objects may be achieved, in one form of the method of our invention, by depositing a thin layer of amorphous semiconductor material upon an insulating substrate, such as glass, implanting ions into the film at an implant energy and dosage sufficient to disrupt the interface between the amorphous layer and the insulating substrate, and subsequently annealing the implanted film to cause its crystallization. By the appropriate selection of the ion species, implant energy and dosage relative to the thickness and type of the amorphous layer and its underlying substrate, sufficient energy will be directed at the interface to impede the nucleation process during subsequent annealing and allowing the growth of large grains.

BRIEF DESCRIPTION OF THE DRAWINGS

Other objects and further features and advantage of our invention will be apparent from the following description, considered together with the accompanying drawings, wherein.

DETAILED DESCRIPTION OF THE INVENTION

It is the intent of our invention to start out with a large area (perhaps page size) amorphous insulating substrate upon which is deposited a thin amorphous semiconductor layer. Then the amorphous semiconductor layer is ion implanted in a controlled manner so as to disrupt the interface and retard nucleation during a subsequent annealing step. Since we start with an amorphous film we are assured that there are no nuclei present in its as-deposited state. During thermal annealing, random temperature dependent nucleation from the interface occurs, resulting in some embryos of nuclei gaining enough energy over time to reach critical size and become nuclei. These continue to grow into larger crystalline grains until they encounter other growing grains which will mutually impede their further growth. Our process of retarded random nucleation is to be distinguished from the well known recrystallization processes wherein a crystalline semiconductor is first selectively amorphized and is then recrystallized from the few undestroyed nuclei. In the known process, wherein there are a predetermined number of nuclei at the initiation of the annealing step, the final grain size is limited by the density of these nuclei.

Figure 1:
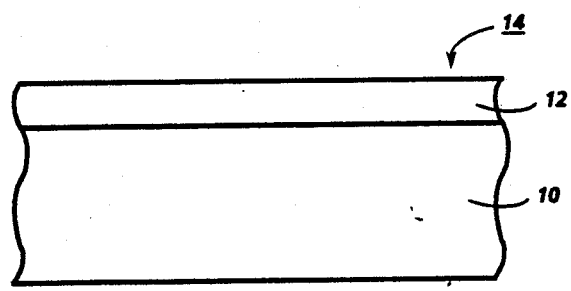
FIG. 1 is a schematic cross-sectional view of an insulator substrate with an amorphous silicon film thereon.

In FIG. 1 there is shown a glass substrate 10 upon which a thin layer 12 of amorphous silicon, about 1000Å thick has been deposited during the first step of our process to form a composite structure 14. Deposition may be accomplished by LPCVD (low pressure chemical vapor deposition), by PECVD (plasma enhanced chemical vapor deposition) or by any other suitable method. A preferred glass is Corning 7059 ® which, since it has an anneal point of 630° C. should not be processed at a temperature exceeding 600° C. for an extended period of time. Typically, we deposited the amorphous silicon film in a LPCVD reactor via the pyrolysis of pure silane ($SiH_4$), introduced at a flow rate of 100 sccm, at a temperature of 575° C. and a pressure of 0.35 Torr. When deposition was accomplished by PECVD, typically we deposited the amorphous silicon film in an RF plasma reactor via the decomposition of pure silane, introduced at a flow rate 68 sccm, at a temperature of 250° C., a pressure of 0.28 Torr and an RF power of 3 Watts.

Figure 2:
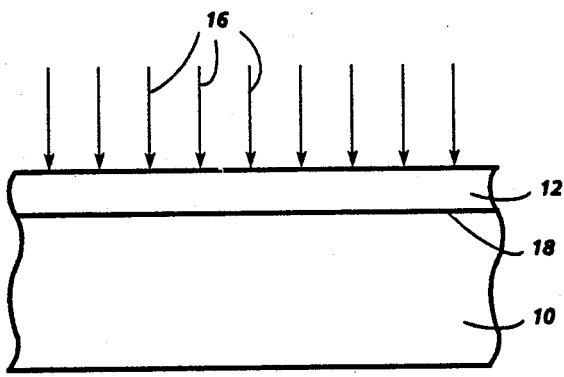
FIG. 2 is a schematic cross-sectional view of the FIG. 1 composite film structure being ion implanted.
Figure 3:
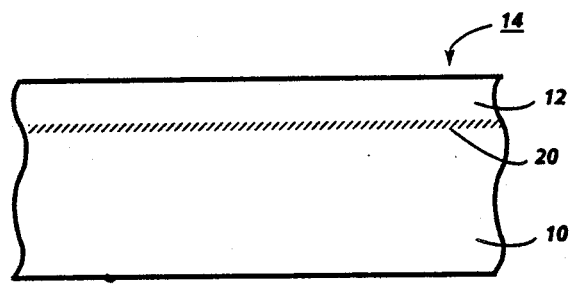
FIG. 3 is a schematic cross-sectional view of the FIG. 1 structure showing the disruption of the interface caused by the ion implantation.

After deposition the composite structure 14 is placed in a known particle accelerator where it is subjected to controlled ion implantation, as schematically illustrated by arrows 16 in FIG. 2. It is the purpose of the implantation to bombard the interface with properly chosen ion acceleration energy so as to disrupt the well defined interface 18 between the silicon layer 12 and the silicon dioxide substrate 10 and create an illdefined interface 20, as shown in FIG. 3. This may be accomplished optimally by locating the position of the peak of the implanted ion concentration depth profile (identified as projected range $R_p$) in the vicinity of the interface 18. To form an undoped silicon layer, we implant with $Si^+$ ions. Of course, it is well understood that if it is desired to dope the semiconductor layer the implantation step may be accomplished with ions of phosphorus or other electrically active elements such as, for example, boron, arsenic or antimony, while achieving substantially the same grain size enhancement results.

Subsequent to the implantation step, the composite layer 14 is subjected to thermal annealing at 600° C. for a length of time necessary to provide the crystallization kinetics to grow grains to completion. By comparison with the results we have obtained, it should be noted that as-deposited (non-implanted) amorphous silicon films, when annealed at 600° C., immediately begins to crystallize from the interface, indicating that nucleation initiates immediately. On the other hand, ion implantation of amorphous silicon films, controlled in accordance with our process, alters the microstructure of the interface so that it is energetically less favorable to nucleate during the thermal activation step. After a retardation period, grains nucleate from the interface and grow to a much larger final grain size.

Figure 4:
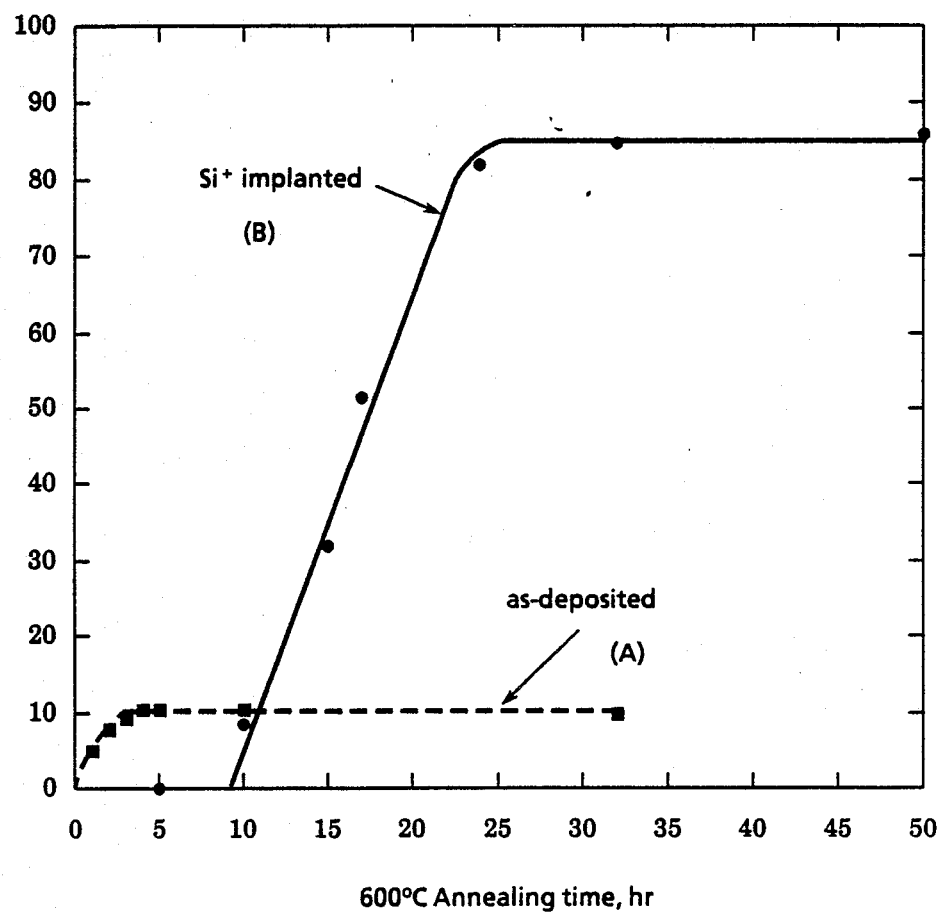
FIG. 4 illustrates representative curves showing grain size as a function of annealing time for as-deposited and implanted LPCVD (low pressure chemical vapor deposition) amorphous silicon films.

In FIG. 4, the difference between the crystallization kinetics in as-deposited and deep implanted LPCVD amorphous silicon may readily be seen. Annealing time is plotted against X-ray diffraction intensity during annealing (a readily obtained measurement which correlates with grain size). Curve A represents an as-deposited (un-implanted) amorphous silicon layer. It is important to note that crystal growth begins immediately, starting at the interface, with maximum grain size being on the order of 0.1 to 0.2 microns. By dramatic contrast, curve B represents an amorphous silicon layer deep implanted with $Si^+$ ions in accordance with our invention, in which there is a retardation (incubation) period of about ten hours during which no crystal growth occurs, followed by the rapid growth of large area grains. We have been able to grow large grain polycrystalline films with grains of about 2 to 3 microns in size.

Figure 5:
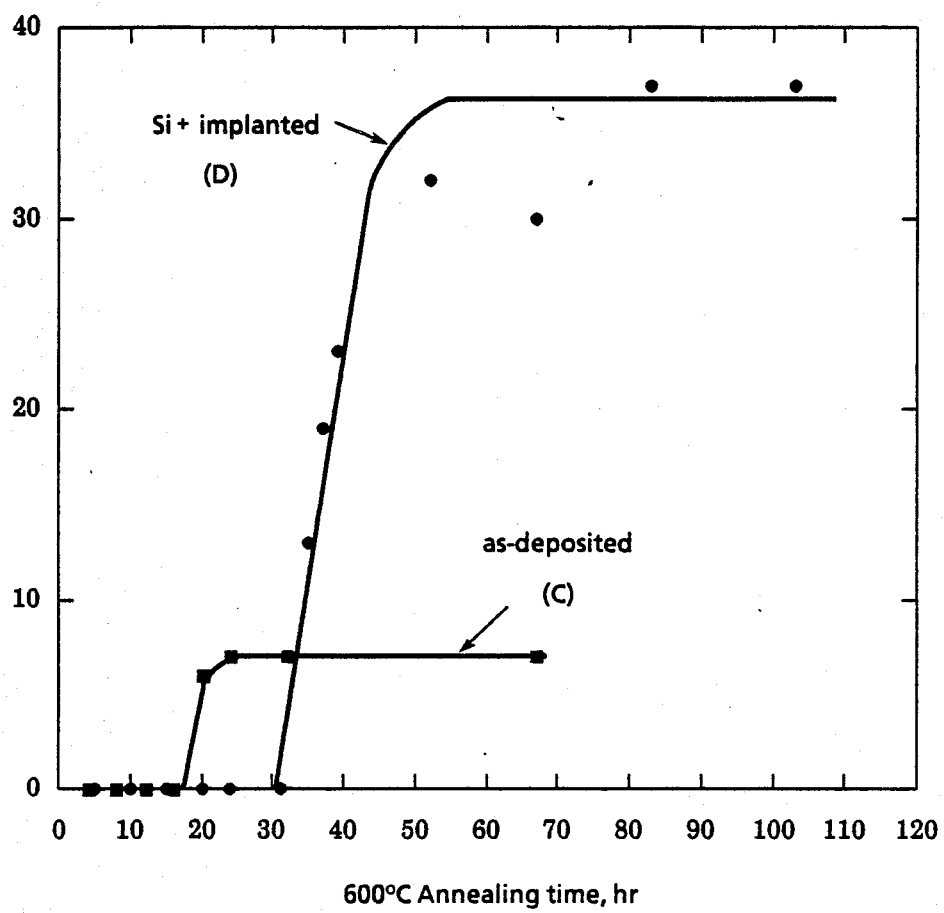
FIG. 5 illustrates representative curves showing grain size as a function of annealing time for as-deposited and implanted PECVD (plasma enhanced chemical vapor deposition) amorphous silicon films.

Similarly, in FIG. 5, the difference between the crystallization kinetics in as-deposited (curve C) and deep implanted (curve D) PECVD amorphous silicon may readily be seen. In this case, the as-deposited (un-implanted) film exhibits a retardation of nucleation for about sixteen hours when annealed at 600° C. However, after deep ion implantation similar results appear, namely, retardation is prolonged and the maximum grain size is increased.

Figure 6:
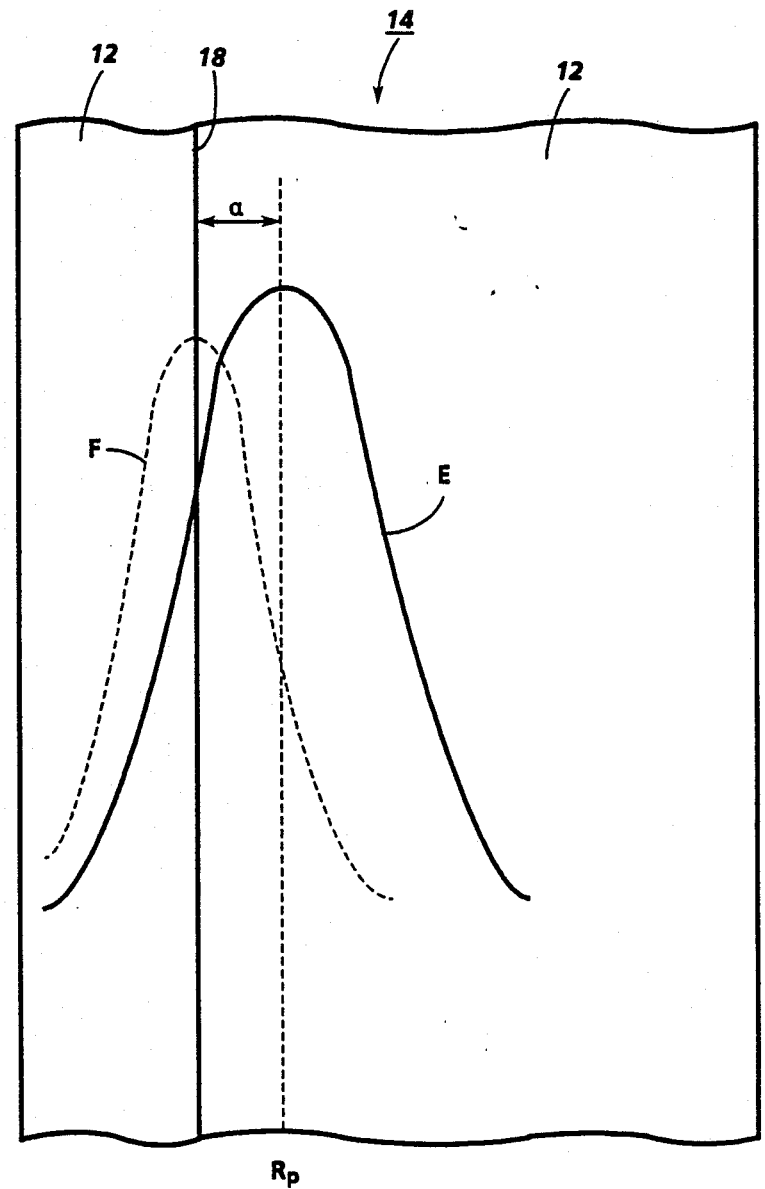
FIG. 6 is an idealized graphic representation of the optimal implanted ion density distribution relative to the interface of the composite film structure for grain size enhancement.

In FIG. 6, we illustrate implantation ion concentration depth profile E superimposed upon the composite film structure 14, under optimum interface disruption conditions ($R_p \approx t_{Si} + 1\sigma$, where $R_p$ is the peak of the implant profile, $t_{Si}$ is the thickness of the amorphous silicon film, and $\sigma$ is a standard deviation of the implant profile), it is well known that the peak of the damage profile (maximum deposited kinetic energy ion concentration depth profile) lags the peak of the implant profile ($R_p$) by about one standard deviation as reported in "*Recoil Contribution to Ion-Implantation Energy-Deposition Distributions*" by Brice, published in Journal of Applied Physics, Vol. 46, No. 8, August 1975. Therefore, curve F of FIG. 6 clearly shows that the maximum disruption occurs at the interface when the peak of the implant concentration profile ($R_p$) is located about one standard deviation beyond the interface 18, into the substrate 10.

Figure 7:
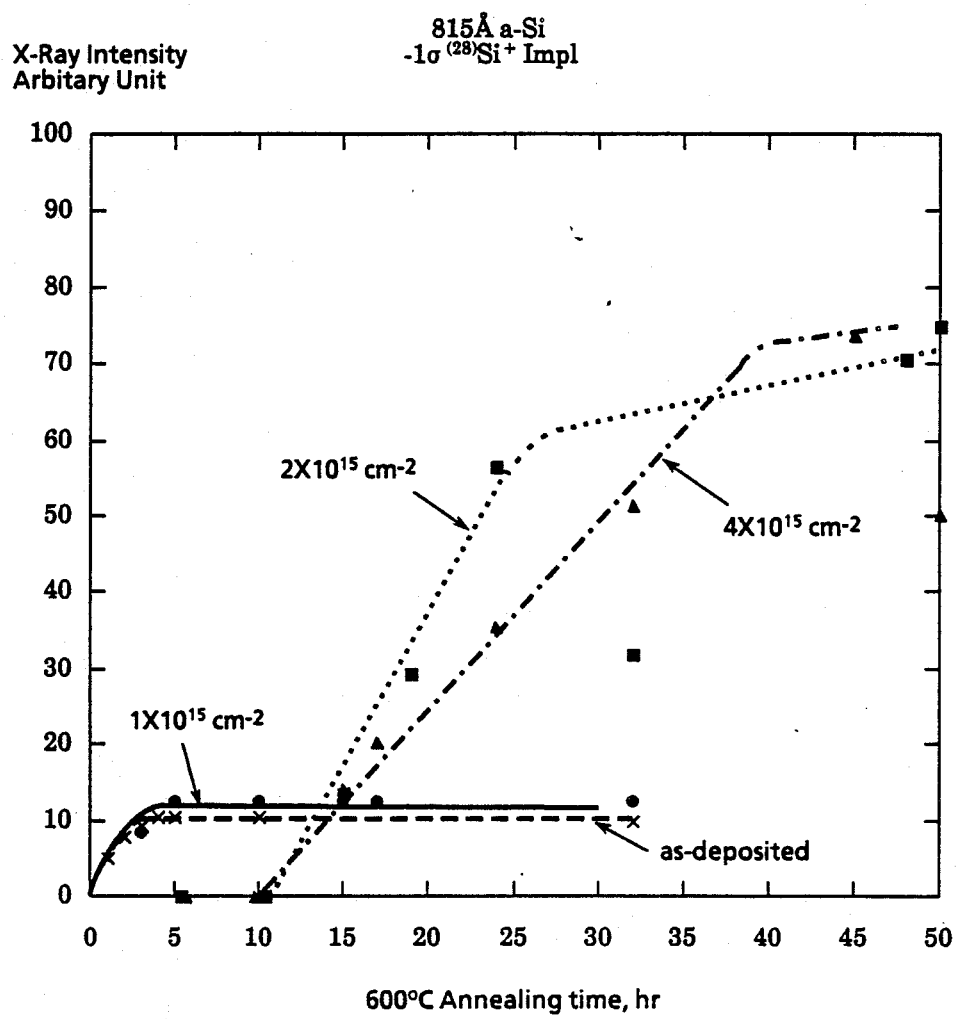
FIG. 7 illustrates experimental curves showing grain size as a function of implant dose for an implant concentration peak located slightly shallower than the interface between the LPCVD amorphous film and its substrate.
Figure 8:
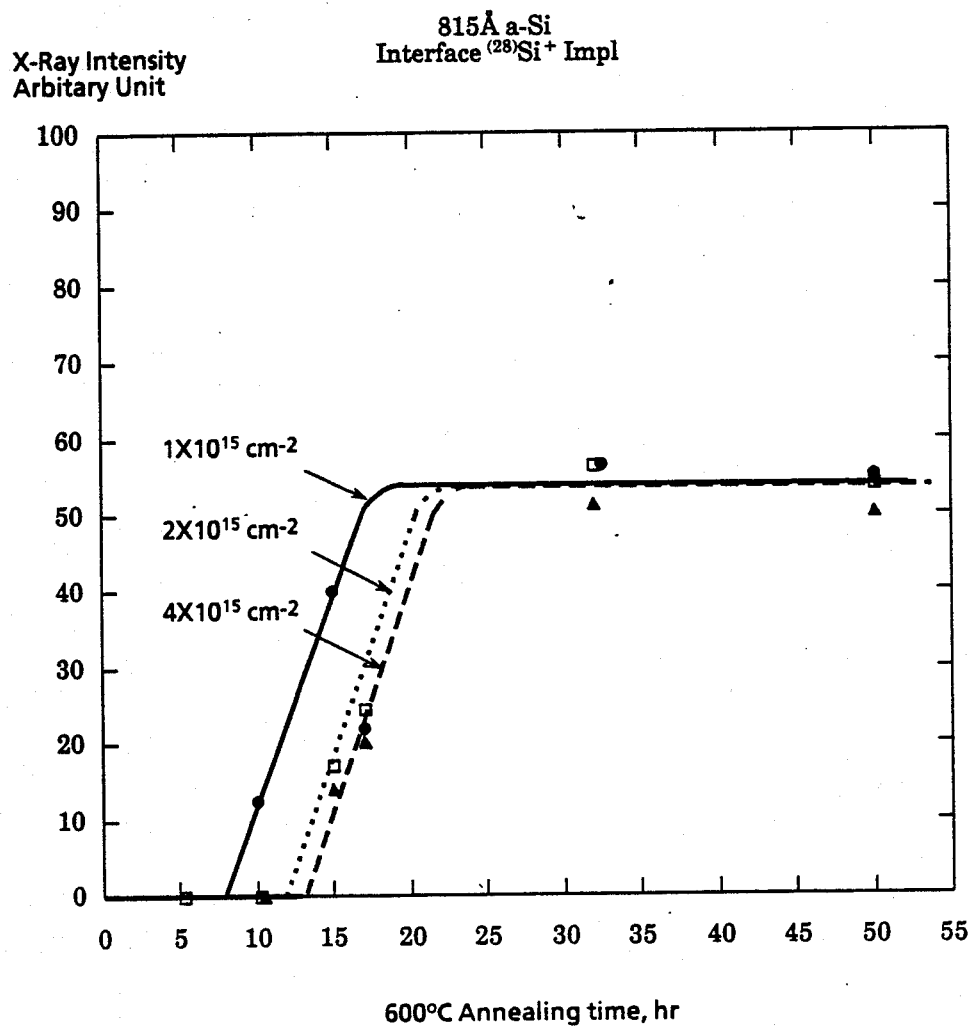
FIG. 8 illustrates experimental curves showing grain size as a function of implant dose for an implant concentration peak at the interface.
Figure 9:
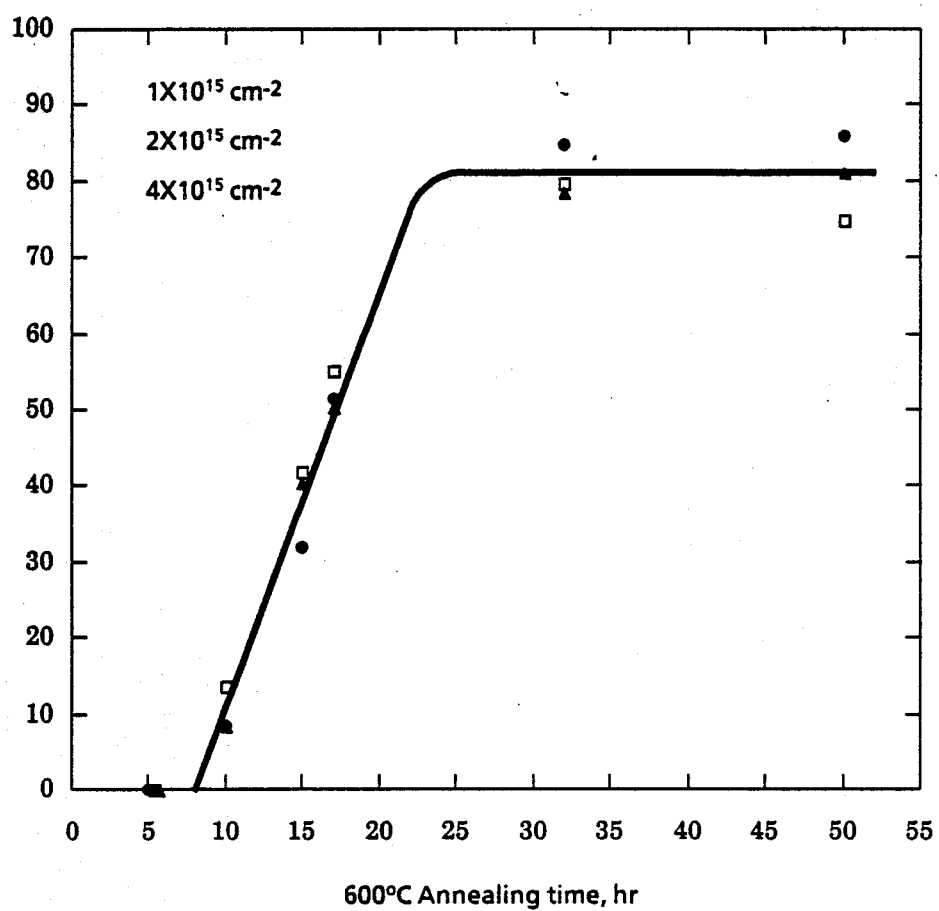
FIG. 9 illustrates experimental curves showing grain size as a function of implant dose for an implant concentration peak located slightly deeper than the interface.

FIGS. 7, 8 and 9 show the effect of implant energy and dose on grain growth kinetics as indicated by X-ray diffraction intensity for a 815Å LPCVD amorphous silicon film annealed at 600° C. In FIG. 7, the ion species $^{28}Si^+$ implant slightly shallower than the interface 18, within the amorphous silicon film 12 ($R_p = t_{Si} - 1\sigma$), is achieved with an implant energy of 40 KeV. A strong dose dependence may be observed. In fact, the film with the smallest dose of $1 \times 10^{15}$ cm$^{-2}$ behaves virtually the same as the as-deposited film. When a sufficiently large dose is provided ($2 \times 10^{15}$ and $4 \times 10^{15}$) crystallization retardation and large grain growth is obtained. Although not shown, we have observed that the crystallization kinetics of a film implanted with a dose of $2 \times 10^{15}$ cm$^{-2}$ at mid-film ($R_p = \frac{1}{2}t_{Si}$) is identical to that of an as-deposited film. In FIG. 8, the $^{28}Si^+$ implant at the interface ($R_p = t_{Si}$) is achieved with an implant energy of 58 KeV. Each of the doses used is sufficiently high to obtain large grain growth. The best and most consistent results were observed in FIG. 9, wherein the $^{28}Si^+$ implant slightly deeper than the interface ($R_p = t_{Si} + 1\sigma$), into the SiO$_2$ substrate 10, is achieved with an implant energy of 92 KeV. The nucleation retardation time remains about the same but the grain size is substantially larger. It should be noted that all the doses result in the same retardation and grain size, therefore it can be concluded that the disruption threshold has been exceeded.

When the amorphous silicon film is deposited upon the substrate, there is a molecularly sharp interface between the two layers, with pure Si on one side and SiO$_2$ on the other. It is our intent to add sufficient kinetic energy to disturb and modify this sharp interface, by ion mixing, in order to alter the energy requirement for nucleation at the interface. The following explanation is our present understanding of the mechanism of grain size enhancement by deep ion implantation. Ion energy provided in the vicinity of the interface breaks the SiO$_2$ bonds in the substrate adjacent the interface, causing oxygen atoms to be recoiled into the silicon film. The presence of recoiled oxygen within the silicon film is believed to impede the nucleation process by changing the volumetric free energy of the amorphous silicon. In other words, we suppress the nucleation process by modifying the interface so that it is energetically less favorable to nucleate. After ion implantation, the atoms must wait in a highly disrupted state for sufficient thermal energy to be provided to rearrange themselves into a crystal lattice orientation. When the thermal annealing is initiated, the atoms begin to vibrate more rapidly and seek to align themselves into an orderly lattice. As they randomly begin to be aligned, they first form small clusters, or embryos, which have a tenuous lifetime and require further energy to continue to grow to the size of a critical nucleus. Once the critical nucleus is formed, the crystal will start to grow, as long as thermal energy is supplied, until its further growth is impeded by competing growth of an adjacent crystal.

Figure 10:
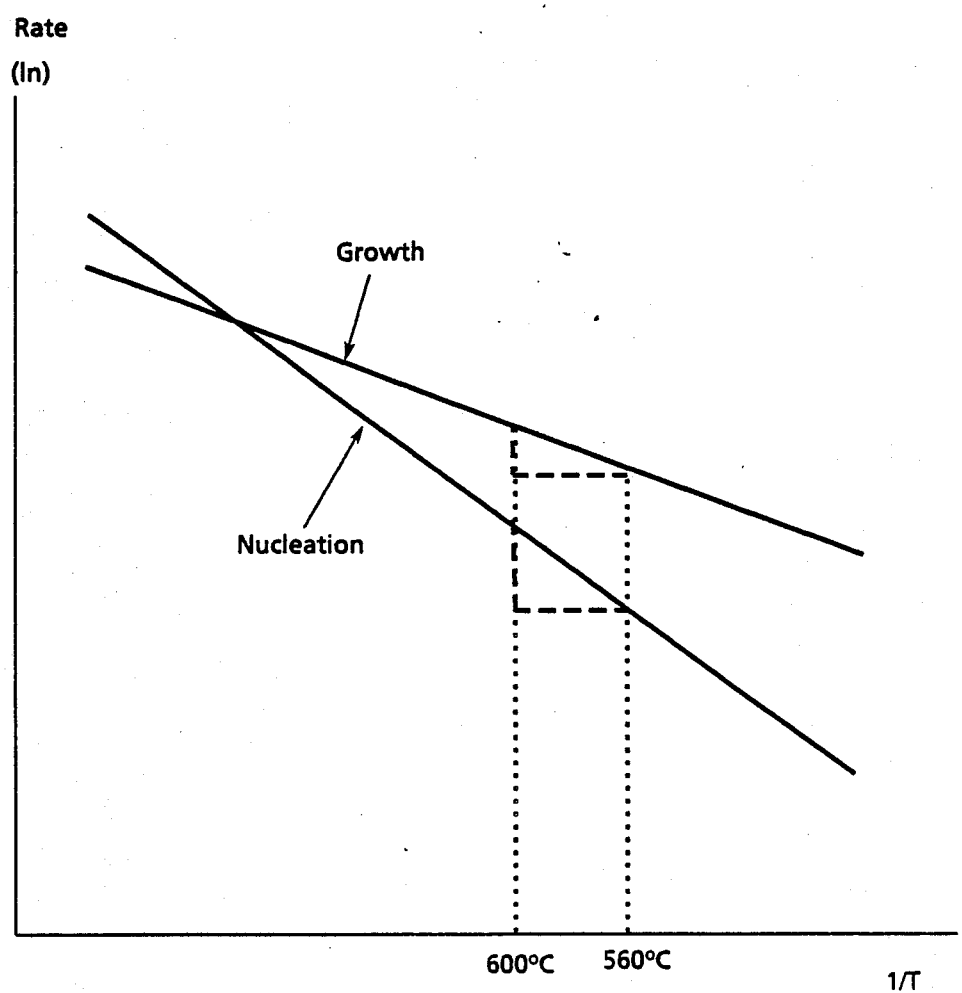
FIG. 10 illustrates the temperature dependence of nucleation rate and growth rate of crystalline grains in the random crystallization process.

Our random nucleation process can be controlled to obtain larger grains by reducing the annealing temperature. In FIG. 10 we have schematically plotted the natural log (ln) of the nucleation rate (N {events/cm$^2$-sec}) and growth rate (G {cm/sec}) of crystalline grains, as functions of reciprocal temperature (1/T), in a random crystallization process. For a given reduction in annealing temperature nucleation will proceed slower and, since fewer nuclei are formed, the growth from those that do form will result in larger grains. Since they are thermally activated processes these plots closely follow the Arrhenius Law equation $\{ln(N) = ln(N_o) - (Q_N/kT)\}$, for nucleation, and $\{ln(G) = ln(G_o) - (Q_G/kT)\}$, for growth. As the activation energy for nucleation $Q_N$ is larger than that for growth $Q_G$, we can expect a stronger influence on nucleation than on growth upon lowering the anneal temperature, as is illustrated graphically by the plots in FIG. 10. By way of example, in a 1000 Å thick, Si$^+$ implanted LPCVD amorphous silicon film, $Q_N = 3.0$ eV and $Q_G = 1.6$ eV. With the annealing temperature lowered from 600° C. to 560° C., the nucleation rate (N) will decrease by a factor of 6.8, while the growth rate (G) is reduced by a factor of only 2.8. Considering that nucleation density is an areal dimension and we usually measure grain size by an average linear dimension (diameter), we must take the square root of the nucleation rate (2.6×) as an indication of the increase in grain size, up to about 8 microns. The correspondingly longer anneal time (2.8×) required for crystallization saturation is still quite practical for implementation.

It should be borne in mind that our method relies upon the use of an amorphous semiconductor film rather than a polycrystalline film as reported in the Noguchi et al and Kung et al articles, for three important reasons. First, the amorphous film may be practically deposited at a lower temperature (about 580° C.) than required for a polycrystalline film (greater than 625° C.), a fact that is significant since the higher temperature is only marginally compatible with the preferred low cost glass substrates. Sound, as-deposited amorphous film has an extremely smooth surface which is important to maintain high mobility in MOSFET devices which rely upon a surface channel for conduction. A rough surface, as is more typical with as-deposited polycrystalline films, will cause the carriers in a subsequently formed device to scatter when crossing the channel, thus lowering carrier mobility. Third, for a given set of implant conditions, we can control the grain size by varying the annealing temperature. By contrast, the grain size of the recrystallized amorphized polycrystalline films known in the art is predetermined because of their preexisting nuclei. At first glance there appear to be strong similarities between the implantation of an ion species through the exposed surface of a substrate supported semiconductor film in our invention and in the prior art teachings. This is not the case, because our implantation is performed for an entirely different purpose and therefore is controlled differently. In the known method, the ion implantation step is conducted at a predetermined angle for disrupting the crystal lattice structure of the polycrystalline film in order to convert most of it to an amorphous state. While the directional ion beam destroys most of the crystals it is critical that it leave some nuclei in the film from which grain growth may start as soon as annealing begins. In our invention, we have no grain nuclei to begin with and we effect the ion implantation step in order to provide sufficient energy to "stir up" the interface and to retard the nucleation process. When nucleation does begin, it does so randomly and not from preexisting nuclei.

It should be understood that the present disclosure has been made only by way of example. For example, although we have described our invention with respect to a silicon dioxide substrate, it may be practiced upon a silicon carbide, a silicon nitride, or other suitable substrate. In such cases, after deep ion implantation, carbon or nitrogen or other atoms would recoil across the interface and change the nucleation rate. Similarly, the amorphous semiconductor material may be silicon, germanium, alloys of silicon and germanium, alloys of silicon and carbon, or other suitable material. Therefore, numerous changes in the method parameters and materials described may be resorted to without departing from the true spirit and scope of the invention as hereinafter claimed.

What is claimed is:

1. A method for forming large grain polycrystalline films comprising the steps of
    providing a layer of insulating material,
    depositing a layer of amorphous semiconductor material upon said layer of insulating material to form a composite structure,
    implanting an ion species into said composite structure at an implant energy and dosage so that the projected range of implantation is in the vicinity of the interface between said amorphous layer and said layer of insulating material so as to disrupt said interface by causing enough atoms from said layer of insulating material to recoil into said amorphous layer so that said amorphous layer will be energetically less favorable to nucleate and to grow grains, and
    annealing said composite structure at a temperature and at a steady state at which the suppression of the rate of nucleation by said implantation in said amorphous layer is more than the suppression of the rate of grain growth by said implantation in said amorphous layer, whereby random nucleation occurs within said amorphous layer to form a large grain polycrystalline film at saturation of grain growth.

2. The method of claim 1 wherein said amorphous semiconductor material is elemental and said ion species is of the same element as said amorphous semiconductor material.

3. The method of claim 2 wherein said amorphous semiconductor material is silicon.

4. The method of claim 1 wherein said ion species is of a different element than said amorphous semiconductor material in order to dope said semiconductor material.

5. The method of claim 1 wherein said layer of insulating material comprises silicon dioxide and said implanting step causes oxygen to recoil across the interface from said insulating material into said amorphous layer.

6. The method of claim 1 wherein said layer of insulating material comprises silicon nitride and said implanting step causes nitrogen to recoil across the interface from said insulating material into said amorphous layer.

7. A method for forming large grain polycrystalline films comprising the steps of
    providing a layer of insulating material,
    depositing a layer of amorphous semiconductor material upon said layer of insulating material to form a composite structure having an interface between said semiconductor material and said layer of insulating material,
    implanting an ion species into said composite structure at an implant energy and dosage sufficient to cause the maximum kinetic energy of said implantation to be deposited substantially at said interface for the purpose of disrupting said interface by causing enough atoms from said insulating material to recoil into said amorphous layer so that said amorphous layer will be energetically less favorable to nucleate and to grow grains, and
    annealing said composite structure at a temperature and at a steady state at which the suppression of the rate of nucleation by said implantation in said amorphous layer is more than the suppression of the rate of grain growth by said implantation in said amorphous layer, whereby random nucleation occurs within said amorphous layer to form a large grain polycrystalline film at saturation of grain growth.

8. The method of claim 7 wherein said amorphous semiconductor material is elemental and said ion species is of the same element as said amorphous semiconductor material.

9. The method of claim 8 wherein said amorphous semiconductor material is silicon.

10. The method of claim 7 wherein said ion species is of a different element than said amorphous semiconductor material in order to dope said semiconductor material.

11. The method of claim 7 wherein said layer of insulating material comprises silicon dioxide and said implanting step causes oxygen to recoil across the interface from said insulating material into said amorphous layer.

12. The method of claim 7 wherein said layer of insulating material comprises silicon nitride and said implanting step causes nitrogen to recoil across the interface from said insulating material into said amorphous layer.

13. A method for forming large grain polycrystalline films comprising the steps of
    providing a layer of insulating material,
    depositing a layer of amorphous semiconductor material upon said insulating material to form a composite structure, implanting an ion species into said composite structure at an implant energy and dosage so that the projected range of implantation is in the vicinity of the interface between said amorphous layer and said layer of insulating material so as to disrupt said interface by causing recoil of atoms from said insulating material into said amorphous layer so that said amorphous layer will be energetically less favorable to nucleate and to grow grains when said composite structure is annealed, and annealing said composite structure at a temperature and at a steady state so as to cause random nucleation within said amorphous layer and to form a large grain polycrystalline film at saturation of grain growth within said amorphous layer.

14. The method of claim 13 wherein said amorphous semiconductor material is elemental and said ion species is of the same element as said amorphous semiconductor material.

15. The method of claim 14 wherein said amorphous semiconductor material is silicon.

16. The method of claim 13 wherein said ion species is of a different element than said amorphous semiconductor material in order to dope said semiconductor material.

17. The method of claim 13 wherein said layer of insulating material comprises silicon dioxide and said implanting step causes oxygen to recoil across the interface from said insulating material into said amorphous layer.

18. The method of claim 13 wherein said layer of insulating material comprises silicon nitride and said implanting step causes nitrogen to recoil across the interface from said insulating material into said amorphous layer.

* * * * *